United States Patent
Barillere et al.

(10) Patent No.: US 10,645,846 B2
(45) Date of Patent: May 5, 2020

(54) HOUSING FOR AVIONIC EQUIPMENT COMPRISING A COMPOSITE PARTITION AND METAL HEATSINKS

(71) Applicant: Safran Electronics & Defense, Boulogne-Billancourt (FR)

(72) Inventors: Marine Barillere, Boulogne-Billancourt (FR); Muriel Sabah, Boulogne-Billancourt (FR)

(73) Assignee: SAFRAN ELECTRONICS & DEFENSE, Boulogne-Billancourt (FR)

( * ) Notice: Subject to any disclaimer, the term of this patent is extended or adjusted under 35 U.S.C. 154(b) by 0 days.

(21) Appl. No.: 16/308,228

(22) PCT Filed: Jun. 7, 2017

(86) PCT No.: PCT/EP2017/063775
§ 371 (c)(1),
(2) Date: Dec. 7, 2018

(87) PCT Pub. No.: WO2017/211861
PCT Pub. Date: Dec. 14, 2017

(65) Prior Publication Data
US 2019/0269038 A1    Aug. 29, 2019

(30) Foreign Application Priority Data
Jun. 8, 2016 (FR) ..................... 16 55264

(51) Int. Cl.
*H05K 7/20* (2006.01)
*F28F 21/08* (2006.01)

(52) U.S. Cl.
CPC ....... *H05K 7/20545* (2013.01); *F28F 21/084* (2013.01); *F28F 21/085* (2013.01)

(58) Field of Classification Search
CPC ......... B29C 66/71; B29C 70/24; B29C 70/48; B29C 70/885; B29C 43/52; B29C 66/712;
(Continued)

(56) References Cited

U.S. PATENT DOCUMENTS

| 4,771,365 A | 9/1988 | Cichocki et al. |
| 4,974,317 A | 12/1990 | Rodriguez, II et al. |

(Continued)

FOREIGN PATENT DOCUMENTS

EP    0 632 688 A2    1/1995

OTHER PUBLICATIONS https://www.ck12.org/c/physical-science/carbon-monomers-and-polymers/lesson/Carbon-Monomers-and-Polymers-MS-PS/), 2012.*
(Continued)

*Primary Examiner* — Mandeep S Buttar
(74) *Attorney, Agent, or Firm* — Sughrue Mion, PLLC

(57) ABSTRACT

The invention relates to a housing for aircraft avionic equipment including a plate to the surface of which heatsinks are connected. The plate is made of composite, that includes a fibrous reinforcement densified by a polymer matrix; the heatsinks are in a metal alloy having a thermal conductivity higher than or equal to 120 W/m/K; and the heat sinks are assembled with the plate by sewing or knitting using assembling fibres made of organic material or metal.

16 Claims, 3 Drawing Sheets

(58) Field of Classification Search
CPC ............ B29C 66/72141; B29C 66/729; H01L 2924/0002; H01L 23/3737; H01L 21/67103; H01L 23/40; F16D 69/023; F16D 65/126; F16D 2200/0065; F16D 69/026; H05K 1/0366; H05K 2201/0209; H05K 2201/029; H05K 2201/0281; H05K 9/0083; H05K 1/0203; H05K 1/0306
USPC ........ 361/715, 707, 218, 704; 264/257, 258; 428/297.4, 311.51; 442/180, 219, 228, 442/229, 332, 333, 334, 354, 357, 359, 442/376
See application file for complete search history.

(56) References Cited

U.S. PATENT DOCUMENTS

| | | | | |
|---|---|---|---|---|
| 2003/0129905 | A1* | 7/2003 | Dhawan | B01D 39/083 442/316 |
| 2007/0053166 | A1* | 3/2007 | Hwang | H01L 23/427 361/717 |
| 2007/0217164 | A1* | 9/2007 | Fujioka | G06F 1/20 361/721 |
| 2009/0000768 | A1* | 1/2009 | Zheng | F28D 15/0275 165/80.3 |
| 2010/0073883 | A1* | 3/2010 | Miyamato | C23C 24/04 361/709 |
| 2010/0321890 | A1* | 12/2010 | Streyel | H05K 7/20545 361/704 |
| 2011/0198979 | A1* | 8/2011 | Shum | F21K 9/23 313/46 |
| 2012/0020017 | A1 | 1/2012 | Kehret et al. | |
| 2013/0040820 | A1* | 2/2013 | Selvamanickam | H01L 39/16 505/237 |

OTHER PUBLICATIONS

International Search Report of PCT/EP2017/063775 dated Aug. 24, 2017 [PCT/ISA/210].
Search Report and Written Opinion dated Feb. 17, 2017 in corresponding French Application No. 1655264.
Written Opinion issued in corresponding Application No. PCT/EP2017/063775 dated Aug. 24, 2017.

* cited by examiner

HOUSING FOR AVIONIC EQUIPMENT COMPRISING A COMPOSITE PARTITION AND METAL HEATSINKS

CROSS REFERENCE TO RELATED APPLICATIONS

This application is a National Stage of International Application No. PCT/EP2017/063775, filed Jun. 7, 2017, which claims priority from French Patent Application No. 1655264, filed Jun. 8, 2016, the disclosures of each of which are herein incorporated by reference in their entirety.

FIELD OF THE INVENTION

The invention generally relates to the field of on-board aviation electronic equipment, and more particularly the packaging of this equipment for the purpose of increasing the removal of calories produced by the electronics, while reducing the added mass of the heatsinks.

TECHNICAL BACKGROUND

Electronic equipment designed to be mounted in an avionics zone, for example an avionics bay, an engine zone, a wing of an aircraft or even at the landing gear, comprises, in a usually metal packaging also called a housing, a set of electronic boards for dissipating heat.

The evolution of current aircrafts has the effect of subjecting these housings for avionic equipment to increasingly severe thermal and vibrational environments, the electronic boards also dissipating more and more heat into a volume that is steadily reduced. In parallel, airplane manufacturers seek to strongly reduce the mass of the housings, while still allowing the removal of calories produced by the electronics sheltered in the housing and ensuring good mechanical strength. In particular, the vibrational strength of the electronics, by transmitting the least vibration possible to the electronic boards and to their assembly system.

It is therefore sought to remove more effectively the power dissipated by the electronic boards into the same volume, perhaps a more restricted volume, and with reduced mass.

SUMMARY OF THE INVENTION

One objective of the invention is therefore to propose a housing for avionic equipment capable of dissipating a sufficient amount of the heat flux generated by the avionic equipment that it shelters, without however impeding the installation of electronic components of the equipment or increasing its bulk and its mass.

To this end, the invention proposes a housing for aircraft avionic equipment comprising a plate on the surface of which are connected heatsinks, the housing for the equipment being characterized in that:

the plate is made of composite material, said composite material comprising a fibrous reinforcement densified by a polymer matrix, the heatsinks are made of a metal alloy having a thermal conductivity greater than or equal to 120 W/m/K, and the heatsinks are assembled to the plate by sewing or knitting using assembly fibers made of organic or metallic materials.

Certain preferred but non-limiting features of the housing described above are the following, taken individually or in combination:

the heatsinks are entirely or partly cast with the plate in composite material and the assembly fibers, the fibrous reinforcement of the composite material and/or the assembly fibers have a thermal conductivity greater than or equal to 500 W/m/K and comprise at least one of the following materials: carbon, a metal alloy and/or the polymer matrix comprises a thermosetting material such as epoxy, bismaleimide or polyimide resin, or thermoplastic material, the metal alloy has a thermal conductivity greater than or equal to 140 W/m/K, the metal alloy comprises an aluminum alloy, for example a T6061 T6 aluminum alloy, or a copper alloy, a conductive protection layer is applied to a surface of the heatsinks which is in contact with the assembly fibers to avoid galvanic corrosion phenomena, the heatsinks have a base, configured to be sewn or knitted using the assembly fibers, and a protrusion extending from the base, the base comprises a plurality of through openings configured to receive the assembly fibers, the heatsinks have a thickness comprised between 3 and 5 mm, the heatsinks have a height comprised between 4 and 20 mm, the plate made of composite material comprises an internal face, extending facing the avionic equipment, and an external face opposite to the internal face, the heatsinks being attached to the internal face, and/or the plate made of composite material comprises an internal face, extending facing the avionic equipment, and an external face opposite to the internal face, the heatsinks being attached to the external face.

BRIEF DESCRIPTION OF THE DRAWINGS

Other features, aims and advantages of the present invention will appear more clearly upon reading the detailed description which follows, and with reference to the appended drawings given by way of non-limiting examples and in which.

DETAILED DESCRIPTION OF AN EMBODIMENT

Figure 1:
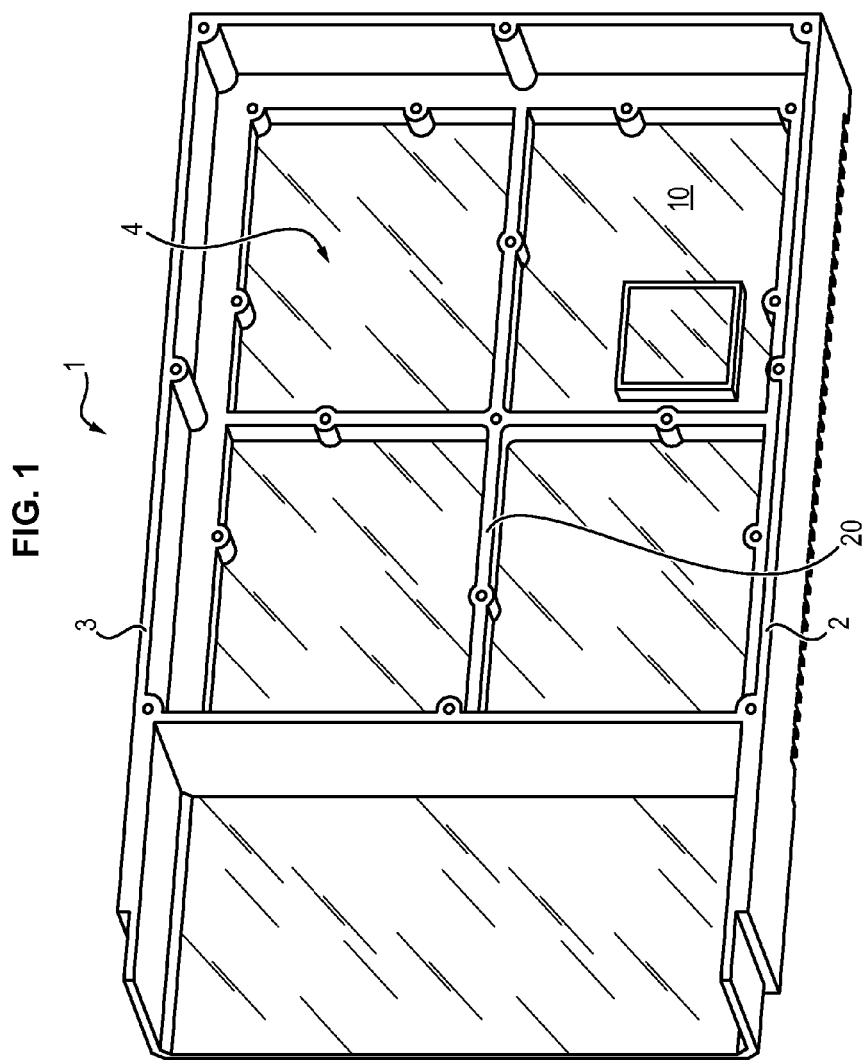
FIG. 1 is a partial and perspective view of an exemplary embodiment of a housing for avionic equipment.

A housing 1 for avionic equipment of an aircraft comprises, in a manner known per se:

a bottom face 2, configured to include first assembly means of at least one electronic board, an upper face 3, substantially parallel and opposite to the bottom face 2 and configured to include second assembly means of at least one electronic board, and two lateral faces 4, extending between the upper face 3 and the bottom face 2.

The housing 1 shelters at least one piece of avionics equipment, typically at least one electronic board (preferably several) and as many assembly means of said electronic boards. These assembly means are generally identical and can comprise, in a manner known per se, slide-bearing supports with locks of the Cardlock type (not visible in the figures). As a variant, the electronic cards can be directly screwed to the housing 1 or a portion attached to said housing 1 (the heatsinks for example).

One at least of the lateral faces 4 of the housing 1 comprises a plate 10 on the surface of which are connected heatsinks 20. The heatsinks 20 form a metal frame allowing, on the one hand, the recovery of the heat flux generated internally by the electronic boards, and on the other hand the stiffening of the lateral face of the housing 1 to which they are attached.

In order to reduce the mass of the housing 1 while retaining its heat dissipation properties, the plate 10 is made of a composite material comprising a fibrous reinforcement densified by a polymer matrix. Moreover, the heatsinks 20 are made of a metal alloy having a thermal conductivity greater than or equal to 120 W/m/K and are assembled to the plate 10 by sewing or knitting using assembly fibers 30 made of organic or metallic material.

Hereafter, the invention will be more particularly described in the case of heatsinks 20 extending from an internal face 12 of the plate 10 (i.e. the face configured to extend in the interior of the housing 1) in order to recover the heat fluxes created internally by the components of the electronic board which propagate in the plane of the electronic board, and to direct them toward the plate 10 made of composite material for the purpose of their dissipation in the ambient environment.

This is however not limiting, the heatsinks 20 being able to extend from the other face (that is the external face 14) of the plate 10 in order to improve heat dissipation of the heat flux to the ambient environment, from the plate 10 made of composite material, by increasing the exchange surface area. If necessary, the housing 1 comprises both heatsinks 20 on the internal face of the plate 10 and on its external face 14.

The fibrous reinforcement of the composite material preferably comprises organic or metal fibers having a thermal conductivity greater than or equal to 500 W/m/K, preferably greater than or equal to 600 W/m/K. For example, the fibrous reinforcement can comprise at least one of the following materials: carbon, particularly based on pitch, or a metal alloy (for example copper, so as to avoid any risk of galvanic corrosion, particularly when copper fibers are coupled with carbon fibers).

The polymer matrix can comprise a thermosetting material such as epoxy, bismaleimide or polyimide resin, or a thermoplastic material.

The assembly fibers 30 can comprise long fibers such as carbon fibers based on pitch. As a variant, the assembly fibers 30 can comprise a metal alloy having a thermal conductivity greater than or equal to 120 W/m/K.

The metal alloy preferably having a thermal conductivity greater than or equal to 140 W/m/K. To this end, the metal alloy can comprise an aluminum alloy, for example of the T6061 T6 series, or a copper alloy.

In one exemplary embodiment, the fibrous reinforcement and the assembly fibers 30 can be made of the same material, the composite matrix can comprise a thermosetting material and the metal alloy can comprise an aluminum alloy.

The use of a composite material for the plate 10 allows increasing the heat dissipation in the plane of the housing 1 while reducing its density. However, composite materials with high heat dissipation have a high cost and are difficult to machine in that it is difficult to obtain parts with high radii of curvature, in particular when the fibrous reinforcement comprising long fibers with a high Young's modulus. Moreover, the precision of positioning of stiffeners and heatsinks at the interface with the electronic boards requires accurate machining, often more easily achievable with a metal alloy.

That is why the use of a metal alloy having such a thermal conductivity is advantageous in order to produce the heatsinks 20. The feasibility of the sinks and their accuracy of manufacture are in fact much better with a metal alloy than with a composite material because there is no longer a limit on radius of curvature, while ensuring an isotropic thermal conductivity sufficient to recover the calories generated by the electronic boards. Moreover, the heatsinks 20 made of metal alloy can play the role of stiffener by stiffening the lateral face of the housing 1 and by increasing its vibrational frequencies.

As a variant, stiffeners can also be applied and attached to the plate 10. Such stiffeners can then be made of metal alloy (low cost and easy to machine) or of composite material so as to avoid any galvanic coupling with the plate 10 (which can occur in the presence of metal). Typically, the composite could be the same material as for the plate 10 with fibers oriented perpendicular to the internal face 12 so as to orient the transfer of heat to the exterior.

Finally, the assembly (sewing or knitting) of the heatsinks 20 to the plate 10 by means of assembly fibers 30 allows ensuring a transverse thermal conductivity while minimizing heat dissipation within the housing 1, in order to allow an effective removal of calories outside the housing 1. The assembly fibers 30 allow in fact a good distribution of the thermal fluxes recovered by the heatsinks 20 in the plate 10 made of composite material, in the three directions, by operating an intimate connection between the assembly fibers 30 and the fibers of the fibrous reinforcement of the plate 10 without notable thermal resistance.

It will be noted that such an assembly can be accomplished at the industrial scale, by directly sewing or knitting the assembly fibers 30 with the fibrous reinforcement of the plate 10.

The heatsinks 20 can have a T shaped cross section.

More precisely, each heatsink can comprise a base 22 configured to be sewn or knitted by means of assembly fibers 30 to the fibrous reinforcement of the plate 10, and a protrusion 24 extending from the base 22. Here the heatsinks 20 are symmetrical, the protrusion 24 extending from a central zone of the base 22.

The base 22 includes a series of through openings 26 on either side of the protrusion 24 serving as anchoring points of the heatsinks 20 in the plate 10 and configured to receive the assembly fibers 30. The through openings 26 can be formed in the base 22 by drilling, or as a variant be obtained during the molding of the base 22. The shape and the dimensions of the through openings 26 depend on the type of fibers selected for the assembly of the heatsinks 20 to the plate 10. To be producible by machining and to be sufficiently dense, an order of magnitude of the diameter of the openings 26 is comprised between 0.5 mm and 1 mm.

Preferably, through openings 26 are formed over the entire length of the heatsinks 20 so as to ensure continuous contact of the base 22 against the plate 10.

This T shape for the heatsinks 20 allows, on the one hand, rapid and industrially producible assembly to the plate 10, and on the other hand stiffening the plate 10 by playing the role of a stiffener.

The heatsinks 20 form, in a manner known per se, a metal frame. The shape and the dimensions of this metal frame can be conventional.

Thus, the metal frame can comprise a peripheral edge 27 with a substantially parallelepiped shape, typically rectangular, and bars 28 extending through the edge 27 so as to form sockets A-E, which can also be parallelepipeds, rectangular for example.

Figure 2:
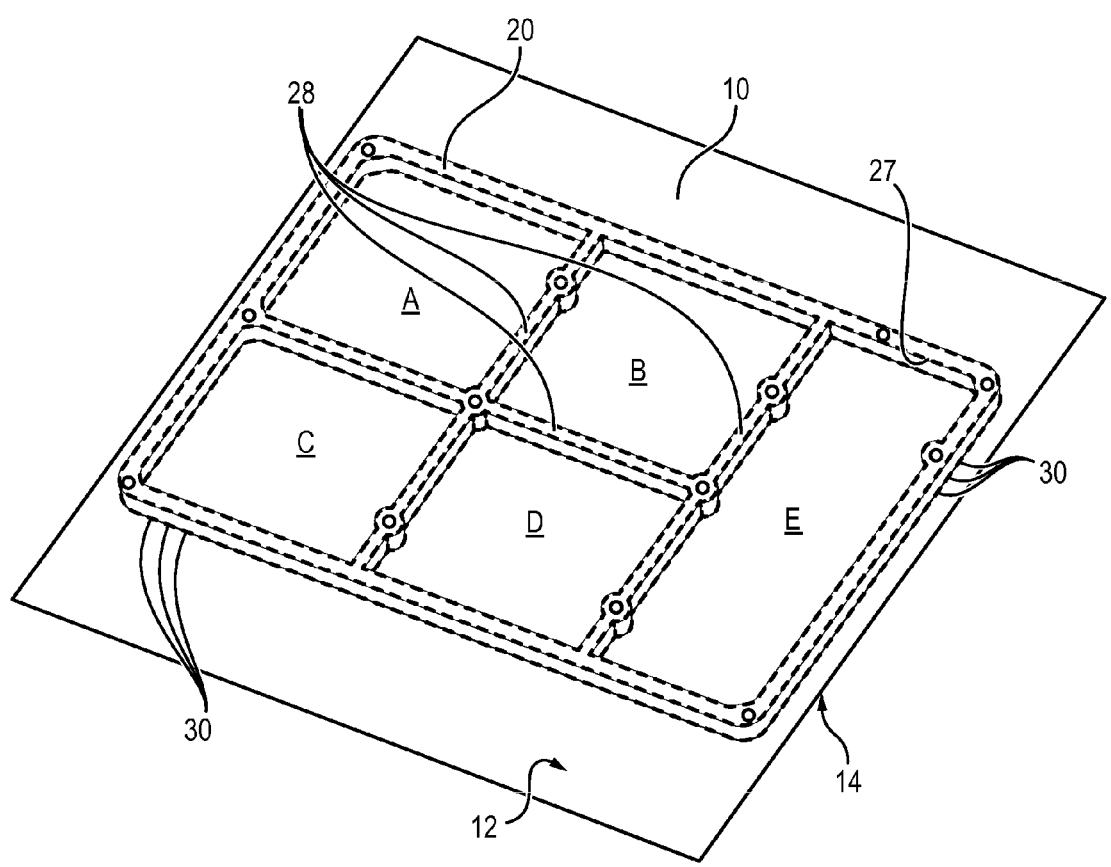
FIG. 2 is a perspective view of an exemplary embodiment of one face of a housing for avionic equipment conforming to the invention.
Figure 3:
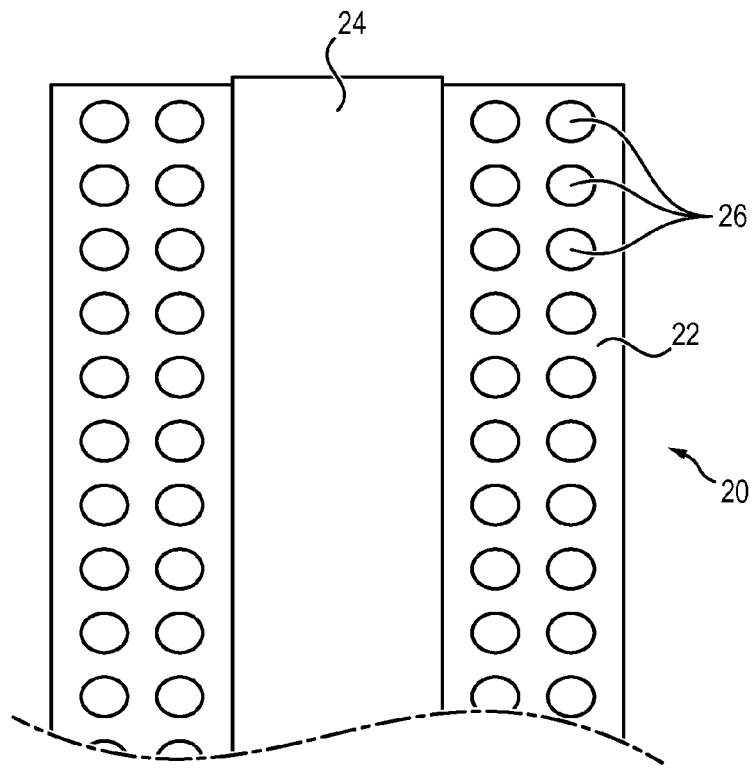
FIG. 3 is a partial view of the top of an exemplary embodiment of a heatsink which can be used in a housing for avionic equipment conforming to the invention.
Figure 4:
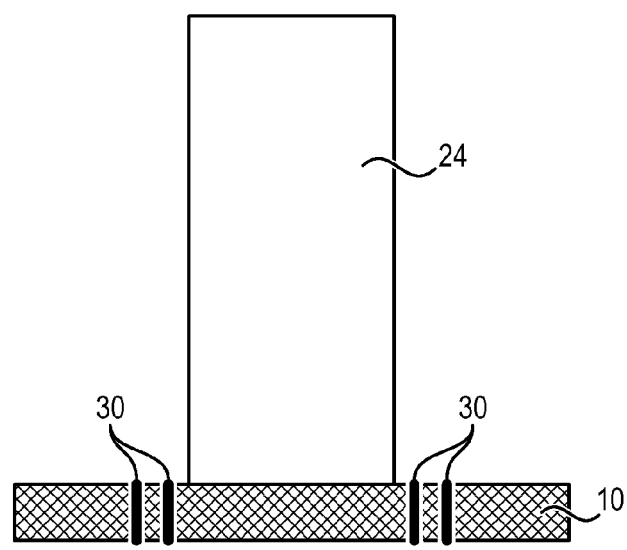
FIG. 4 is a partial section view of the plate and of a heatsink of FIG. 1.

In the exemplary embodiment illustrated by FIG. 2, the metal frame comprises five sockets A-E formed by three bars 28 and a peripheral edge 27.

The selection of the number of bars 28 and of the dimensions of the heatsinks 20 is preferably a compromise between the surface area available for the components of the electronic boards (and therefore of the type of electronic board sheltered in the housing 1), the necessary thermal conductivity for recovering sufficient calories and cool the electronic boards, and the mechanical properties desired for the housing 1 (stiffener function).

In fact, the thicker the heatsinks 20 are (the thickness corresponding here to the small dimension of the heatsink in a direction parallel to the surface of the plate 10, in contrast with the length), the greater their bulk, and the less space remains for the electronic components on the electronic board and the more the mass of the housing 1 increases. However, an increase in the thickness of the heatsinks 20 increases the heat dissipation capacities; a compromise must therefore be found. The thickness of the heatsinks 20 can for example be comprised between 3 mm and 5 mm.

The height (corresponding here to the dimension along a direction normal to the surface of the plate 10) of the heatsinks depends on the height of the necessary components and on the total bulk of the housing 1 which must have the lowest possible height. The height of the heatsinks 20 can be comprised between 4 mm and 20 mm. Certain components which could be higher could be attached on the other side of the electronic board, or necessitate a still greater height of the heatsinks.

Moreover, the smaller the surface area of the sockets formed by the heatsinks 20, the more the heat dissipation is improved (the heat fluxes being directly discharged at the heatsinks 20 by passing through the smallest amount of board surface possible). Moreover, when the surface area of the sockets is small, the socket frequencies (vibrational frequencies of the electronic board at the sockets) are high, which causes small strain rates at the electronic boards and therefore a lower risk of damaging the soldering of the electronic components.

When the fibrous reinforcement of the composite material and/or the assembly fibers 30 comprise organic fibers, particularly carbon fibers, a conductive protection layer can be applied on the surface of the heatsinks 20 which is in contact with the fibers (typically, the base 22 of the heatsinks 20) in order to avoid galvanic corrosion phenomena which would cause dissolution of the metal alloy (especially in the case of an aluminum or copper alloy). Such a phenomenon can in particular occur in the case of water infiltration, salt water in particular. As a variant, to simplify the application of the layer, the entire surface of the heatsinks 20 can be plated.

For example, normal or hard anodizing can be applied to the heatsinks 20 so as to form a passive layer of alumina on all or a part of the surface of the heatsinks 20. The alumina layer obtained is regular, with a constant thickness (between 25 and 100 microns), adheres perfectly to the aluminum alloy, is hard, smooth and very strong. This layer is electrically insulating but thermally conductive (approximately 26 to 35 W/m/K): it is therefore negligible and does not affect the thermal resistance between the fibers (of the fibrous reinforcement and for assembly) and the heatsinks 20.

Alternatively, a copper alloy can be plated by ceramization over all or a part of the surface of the heatsinks 20. The copper alloy having a high thermal conductivity, it also does not affect the thermal resistance between the fibers and the heatsinks 20.

As a variant, the heatsinks 20 can be cast with the fibrous reinforcement of the plate 10 and the assembly fibers 30, during the injection of the polymer matrix to form the composite material. The polymer matrix also allows insulating the metal alloy and the fibers and avoiding galvanic corrosion phenomena.

To this end, during a first step, the metal sinks are first of all positioned on one of the faces of the fibrous reinforcement.

Then, during a second step, the metal sinks are assembled with the fibrous reinforcement, either by sewing or by knitting, using assembly fibers 30, typically using organic fibers.

As a variant, the heatsinks 20 can be assembled with the fibrous reinforcement directly during the production (knitting) of the fibrous reinforcement. In this case, the fibers of the fibrous reinforcement serve both for the production of the reinforcement and as assembly fibers 30.

During a third step, the matrix is introduced into the fibrous reinforcement, for example using the resin transfer molding RTM method, by infusion or by injection. Optionally, the matrix can be infused in such a way as to cover only the base 22 of the heatsinks 20.

In order to reinforce the protection of the heatsinks 20 against galvanic coupling, it is possible to both apply a conductive protection layer and to cast the heatsinks 20 with the polymer matrix.

When the heatsinks 20 extend from the external face 14 of the plate 10, said sinks can have a T shaped cross section, as described previously, or as a variant a U shaped cross section so as to form ribs. To this end, each U shape rib comprises a base 22 from which two arms extend. In this case, the ribs are sewn or knitted on the external face 14 of the plate 10 at the base 22, between the two arms.

It will be noted that, in this embodiment, the heatsinks 20 can have a greater height that when they are attached to the internal face, in that they are not limited by the type or the position of the electronic components attached to the electronic boards.

The invention claimed is:

1. A housing for aircraft avionic equipment comprising a plate on a surface of which are connected heatsinks,
    wherein
    the plate is made of composite material, said composite material comprising a fibrous reinforcement densified by a polymer matrix,
    wherein the heatsinks are made of a metal alloy having a thermal conductivity greater than or equal to 120 W/m/K,
    wherein
    the heatsinks are sewn or knitted to the plate with assembly fibers,
    wherein the assembly fibers are made of an organic or metallic material.

2. The housing according to claim 1, wherein the heatsinks are entirely or partly cast with the plate in composite material and the assembly fibers.

3. The housing according to claim 1, wherein
    at least one of the fibrous reinforcement of the composite material and the assembly fibers have a thermal conductivity greater than or equal to 500 W/m/K.

4. The housing according to claim 1, wherein the thermal conductivity of the metal alloy is greater than or equal to 140 W/m/K.

5. The housing according to claim 1, wherein the metal alloy comprises an aluminum alloy, or a copper alloy.

6. The housing according to claim 5, wherein a conductive protection layer is applied to a surface of the heatsinks which is in contact with the assembly fibers to avoid galvanic corrosion phenomena.

7. The housing according to claim 1, wherein the heatsinks have a base configured to be sewn or knitted using the assembly fibers, and a protrusion extending from the base.

8. The housing according to claim 7, wherein the base comprises a plurality of through openings configured to receive the assembly fibers.

9. The housing according to claim 1, wherein the heatsinks have a thickness comprised between 3 and 5 mm.

10. The housing according to claim 1, wherein the heatsinks have a height comprised between 4 and 20 mm.

11. The housing according to claim 1, wherein the plate made of composite material comprises an internal face, extending facing the avionic equipment, and an external face opposite to the internal face, the heatsinks being attached to the internal face.

12. The housing according to claim 1, wherein the plate made of composite material comprises an internal face, extending facing the avionic equipment, and an external face opposite to the internal face, the heatsinks being attached to the external face.

13. The housing according to claim 1, wherein the polymer matrix comprises a thermosetting material, the thermosetting material comprises epoxy, bismaleimide or polyimide resin, or thermoplastic material.

14. The housing according to claim 5, wherein the metal alloy comprises a T6061 T6 aluminum alloy.

15. The housing according to claim 1, wherein at least one of the fibrous reinforcement of the composite material and the assembly fibers comprise at least one of carbon and a metal alloy.

16. A housing for aircraft avionic equipment comprising a plate on a surface of which are connected heatsinks, wherein the plate is made of composite material, said composite material comprising a fibrous reinforcement densified by a polymer matrix, wherein the heatsinks are made of a metal alloy having a thermal conductivity greater than or equal to 120 W/m/K, and wherein the heatsinks comprise a base and a protrusion, wherein the base is sewn or knitted to the plate with assembly fibers made of organic or metallic material.

* * * * *